US012532455B2

(12) United States Patent
Na et al.

(10) Patent No.: US 12,532,455 B2
(45) Date of Patent: Jan. 20, 2026

(54) SEMICONDUCTOR DEVICE

(71) Applicant: SAMSUNG ELECTRONICS CO., LTD., Suwon-si (KR)

(72) Inventors: Jaewon Na, Suwon-si (KR); Sungsam Lee, Yongin-si (KR); Taiuk Rim, Suwon-si (KR); Byungha Kang, Seoul (KR); Kanghyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 608 days.

(21) Appl. No.: 17/959,634

(22) Filed: Oct. 4, 2022

(65) Prior Publication Data

US 2023/0225113 A1 Jul. 13, 2023

(30) Foreign Application Priority Data

Jan. 10, 2022 (KR) .................. 10-2022-0003187

(51) Int. Cl.
*H10B 12/00* (2023.01)
(52) U.S. Cl.
CPC .................. *H10B 12/315* (2023.02)
(58) Field of Classification Search
None
See application file for complete search history.

(56) References Cited

U.S. PATENT DOCUMENTS

| 9,337,203 | B2 | 5/2016 | Hwang et al. |
| 10,872,811 | B2 | 12/2020 | Chen |
| 10,978,397 | B2 | 4/2021 | Kim et al. |
| 11,074,965 | B2 | 7/2021 | Wang et al. |
| 2015/0061134 | A1* | 3/2015 | Lee ............ H10B 12/34 257/751 |
| 2015/0235950 | A1* | 8/2015 | Han ............ H01L 21/76835 257/773 |
| 2015/0262625 | A1 | 9/2015 | Han et al. |
| 2016/0027727 | A1* | 1/2016 | Kim ............ H10B 12/34 257/774 |

(Continued)

FOREIGN PATENT DOCUMENTS

| KR | 1020160074306 A | 6/2016 |
| KR | 1020200070164 A | 6/2020 |

(Continued)

*Primary Examiner* — Steven M Page
(74) *Attorney, Agent, or Firm* — Muir Patent Law, PLLC

(57) ABSTRACT

A semiconductor device includes a substrate including first and second active regions; a bitline structure extending in one direction on the substrate, the bitline structure being electrically connected to the first active region; a storage node contact on a sidewall of the bitline structure, the storage node contact being electrically connected to the second active region; a spacer structure between the bitline structure and the storage node contact; a landing pad on the storage node contact, the landing pad being in contact with a sidewall of the spacer structure; and a capacitor structure electrically connected to the landing pad, wherein the spacer structure includes a first spacer, a second spacer, a third spacer, and a fourth spacer, sequentially stacked on the sidewall of the bitline structure, the second spacer is an air spacer, and the third spacer has a thickness that is less than a thickness of the first spacer.

20 Claims, 13 Drawing Sheets

(56) References Cited

U.S. PATENT DOCUMENTS

2019/0088739 A1* 3/2019 Lee .................... H10B 12/482
2020/0194439 A1   6/2020 Kim et al.
2020/0395363 A1* 12/2020 Kim ................ H01L 21/76897
2022/0102528 A1   3/2022 Kim et al.

FOREIGN PATENT DOCUMENTS

KR   1020200142908 A   12/2020
KR   10-2022-0043474 A   4/2022

* cited by examiner

SEMICONDUCTOR DEVICE

CROSS-REFERENCE TO RELATED APPLICATION

This application claims benefit of priority to Korean Patent Application No. 10-2022-0003187 filed on Jan. 10, 2022, in the Korean Intellectual Property Office, the disclosure of which is incorporated herein by reference in its entirety.

BACKGROUND

1. Field

Embodiments relate to a semiconductor device.

2. Description of the Related Art

With the development of the electronics industry and increasing demands of users, electronic devices have become more compact and multifunctional.

SUMMARY

The embodiments may be realized by providing a semiconductor device including a substrate including a first active region and a second active region; a bitline structure extending in one direction on the substrate, the bitline structure being electrically connected to the first active region; a storage node contact on a sidewall of the bitline structure, the storage node contact being electrically connected to the second active region; a spacer structure between the bitline structure and the storage node contact; a landing pad on the storage node contact, the landing pad being in contact with a sidewall of the spacer structure; and a capacitor structure electrically connected to the landing pad, wherein the spacer structure includes a first spacer, a second spacer, a third spacer, and a fourth spacer, sequentially stacked on the sidewall of the bitline structure, the second spacer is an air spacer, and the third spacer has a thickness that is less than a thickness of the first spacer.

The embodiments may be realized by providing a semiconductor device including a substrate including a first active region and a second active region; a bitline structure extending in one direction on the substrate and being electrically connected to the first active region; a storage node contact on a sidewall of the bitline structure and electrically connected to the second active region; a spacer structure between the bitline structure and the storage node contact; a landing pad on the storage node contact and in contact with a sidewall of the spacer structure; and a capacitor structure electrically connected to the landing pad, wherein the spacer structure includes a first spacer, a second spacer, a third spacer, and a fourth spacer, sequentially stacked on the sidewall of the bitline structure, the second spacer is an air spacer, the third spacer and the fourth spacer include different materials from one another, and a lowermost surface of the third spacer is on a level that is lower than a level of a lowermost surface of the second spacer.

The embodiments may be realized by providing a semiconductor device including a substrate; a plurality of interconnections on the substrate; an interlayer insulating layer on the substrate; a spacer structure between the interlayer insulating layer and the plurality of interconnections; and a capping layer covering the interlayer insulating layer, the plurality of interconnections, and an upper surface of the spacer structure, wherein the spacer structure includes a first spacer, a second spacer, a third spacer, and a fourth spacer, sequentially stacked on the plurality of interconnections, the second spacer is an air spacer, the third spacer includes a silicon oxynitride, and the third spacer has a thickness that is less than a thickness of the first spacer, less than a thickness of the second spacer, and less than a thickness of the fourth spacer.

BRIEF DESCRIPTION OF DRAWINGS

Features will be apparent to those of skill in the art by describing in detail exemplary embodiments with reference to the attached drawings in which.

DETAILED DESCRIPTION

Figure 1:
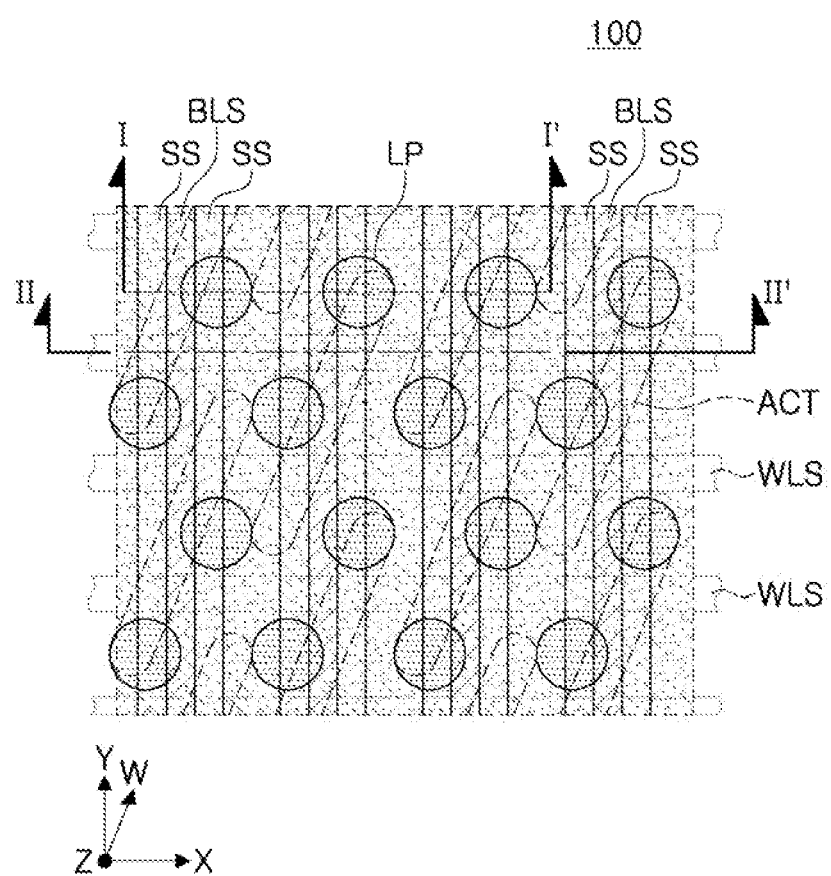
FIG. 1 is a schematic plan view of a semiconductor device according to example embodiments.
Figure 2:
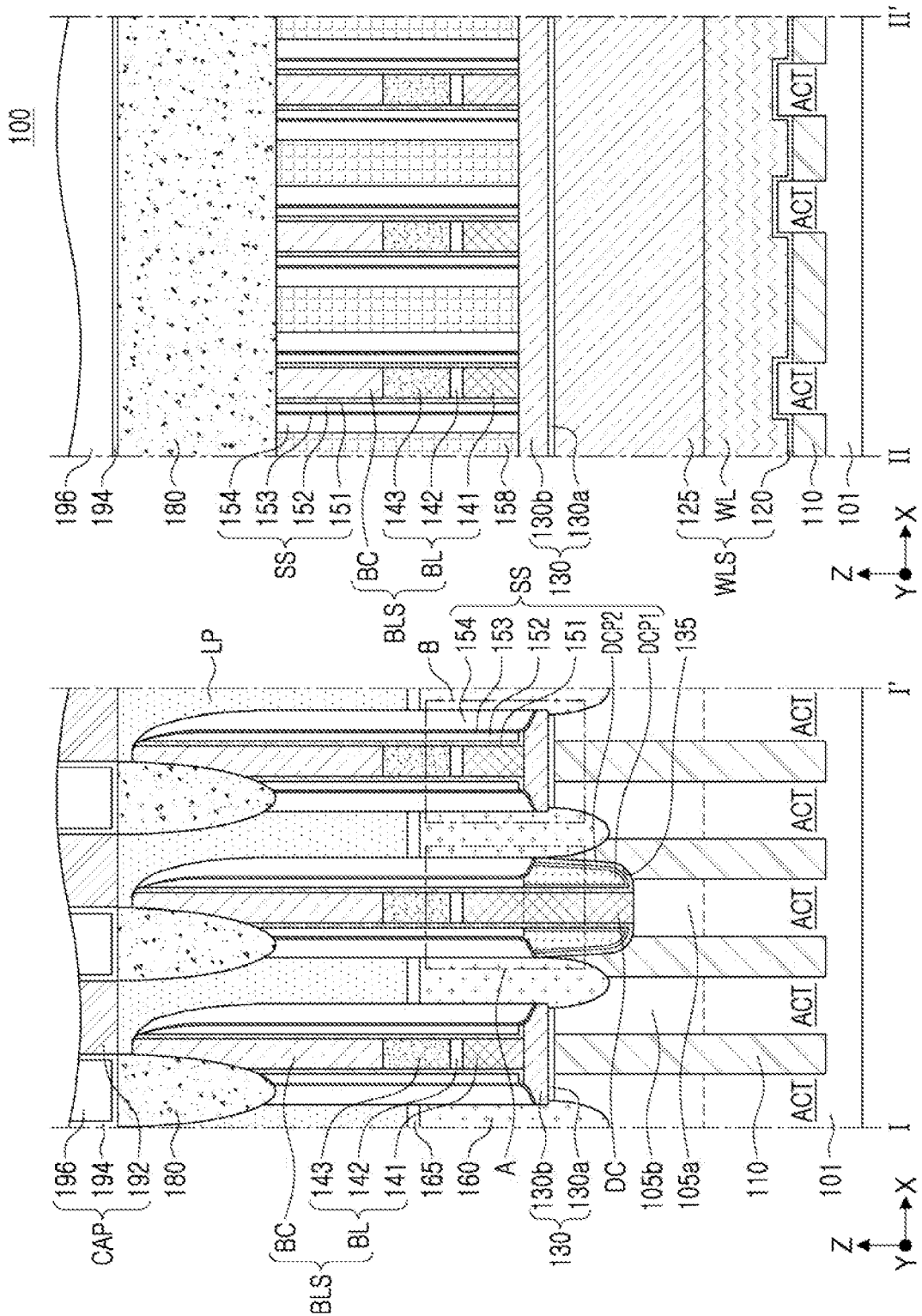
FIG. 2 is a schematic cross-sectional view of a semiconductor device according to example embodiments.
Figure 3:
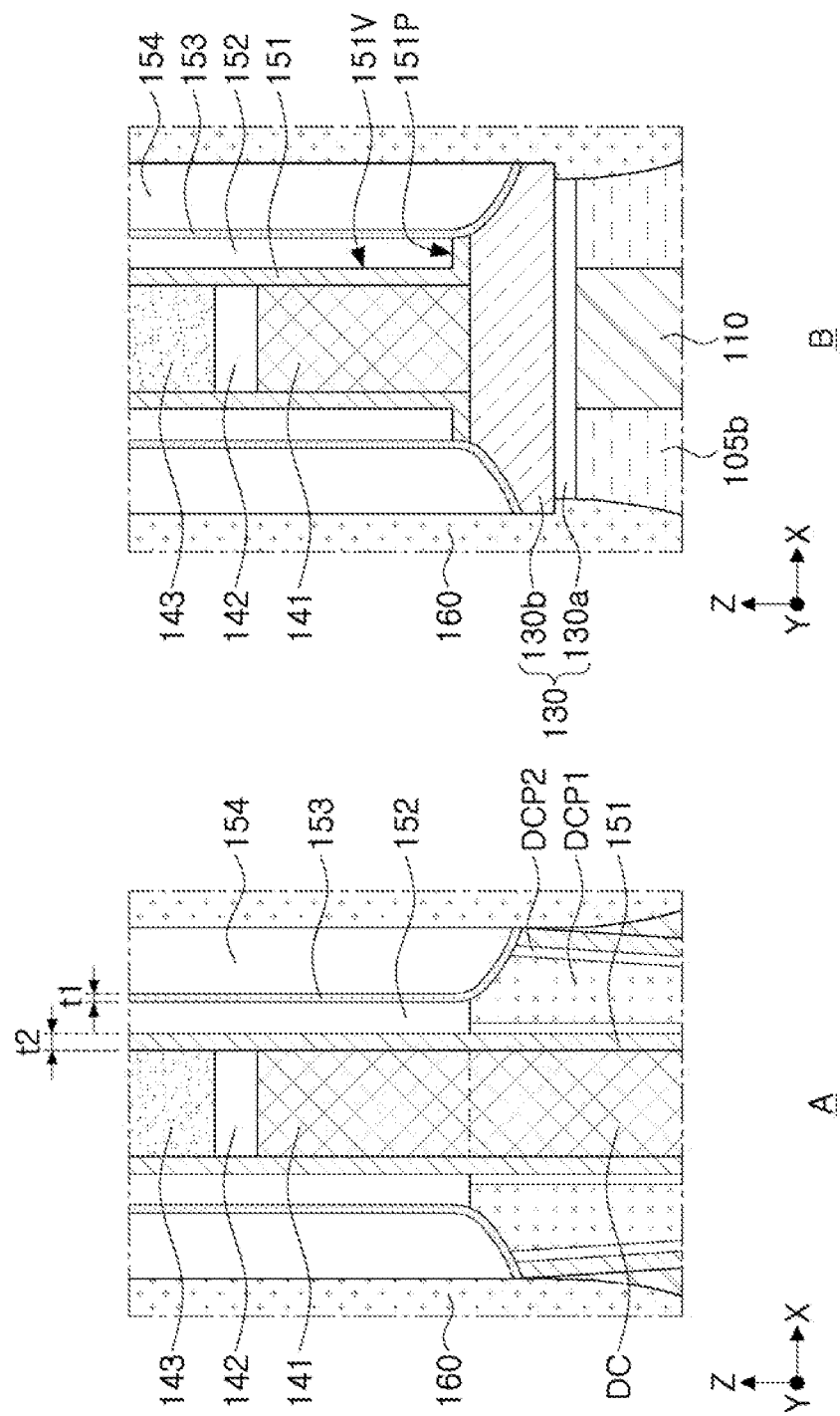
FIG. 3 is a partially enlarged cross-sectional view of a semiconductor device according to example embodiments.

FIG. 1 is a schematic plan view of a semiconductor device according to example embodiments. FIG. 2 is a schematic cross-sectional view of a semiconductor device according to example embodiments. FIG. 2 is a cross-sectional view taken along lines I-I' and II-II' of FIG. 1. FIG. 3 is a partially enlarged cross-sectional view of a semiconductor device according to example embodiments. FIG. 3 is an enlarged view of regions "A" and "B" of FIG. 2.

Referring to FIGS. 1 to 3, a semiconductor device 100 may include a substrate 101 including active regions ACT, wordline structures WLS buried in the substrate 101 to extend and including wordlines WL, bitline structures BLS extending to cross the wordline structures WLS on the substrate and including bitlines BL, spacer structures SS on opposite sides adjacent to the bitline structures BLS, capacitor structures CAP on the bitline structures BLS, a storage node contact 160 electrically connecting the capacitor structures CAP and the active regions ACT to each other, a landing pad LP electrically connecting the storage node contact 160 and the capacitor structures CAP to each other, and a capping insulating layer 180 on the bitline structures BLS. The semiconductor device 100 may further include device isolation layers 110 defining the active regions ACT, a barrier pattern 130 on the substrate 101, a metal-semiconductor layer 165 on the storage node contact 160, and insulating patterns 158 between the bitline structures BLS. In an implementation, the semiconductor device 100 may be applied to, e.g., a cell array of a dynamic random access memory (DRAM).

The substrate 101 may have an upper surface extending in an X-direction and a Y-direction (e.g., in an X-Y plane). The substrate 101 may include a semiconductor material, e.g., a group IV semiconductor, a group III-V compound semiconductor, or a group II-VI compound semiconductor. In an implementation, the group IV semiconductor may include silicon, germanium, or silicon-germanium. The substrate 101 may include, e.g., a silicon substrate, a silicon-on-insulator (SOI) substrate, a germanium substrate, a germanium-on-insulator (GOI) substrate, a silicon-germanium substrate, or a substrate including an epitaxial layer. As used herein, the term "or" is not an exclusive term, e.g., "A or B" would include A, B, or A and B.

The active regions ACT may be defined by the device isolation layers 10. The active region ACT may have a bar shape, and may be in the substrate 101 and have an island shape extending (e.g., lengthwise) in one direction, e.g., a W-direction. The W-direction may be a direction inclined with respect to directions in which the wordlines WL and the bitlines BL extend.

The active region ACT may have first and second impurity regions 105a and 105b having a predetermined depth from an upper of the substrate 101. The first and second impurity regions 105a and 105b may be spaced apart from each other. The first and second impurity regions 105a and 105b may be source/drain regions of a transistor. In an implementation, a drain region may be between two wordlines WL crossing a single active region ACT, and source regions may be outside the two wordlines WL, respectively. The source region and the drain region may be formed by first and second impurity regions 105a and 105b formed by doping or ion-implanting the same impurities, and thus may be reversely referred to as depending on a circuit configuration of a final transistor. The impurities may include dopants having a conductivity type opposite to a conductivity type of the substrate 101. In an implementation, depths of the first and second impurity regions 105a and 105b in the source region and the drain region may be different from each other.

The device isolation layers 110 may be formed by a shallow trench isolation (STI) process. The device isolation layers 110 may allow the active regions ACT to be spaced apart from each other while surrounding the active regions ACT. The device isolation layers 110 may be formed of an insulating material, e.g., an oxide, a nitride, or a combination thereof. In an implementation, each of the device isolation layers 110 may include a plurality of layers.

Each of the wordline structures WLS may include a gate dielectric layer 120, a wordline WL, and a buried insulating layer 125.

The wordlines WL may be in gate trenches extending in the substrate 101. The wordlines WL may extend (e.g., lengthwise) in one direction, e.g., an X-direction, across the active regions ACT in the substrate 101. In an implementation, a pair of wordlines WL may cross one active region ACT. In an implementation, transistors, including the wordlines WL and the first and second impurity regions 105a and 105b, may constitute a buried channel array transistor BCAT.

A wordline WL may be below the gate trenches to have a predetermined thickness. An upper surface of the wordline WL may be on a level, lower than a level of the upper surface of the substrate 101. Here, high and low of the term "level" may be defined based on (e.g., a distance in a vertical Z direction from) a substantially planar upper surface of the substrate 101. The wordline WL may be formed of a conductive material, e.g., polycrystalline silicon (Si), titanium (Ti), titanium nitride (TiN), tantalum (Ta), tantalum nitride (TaN), tungsten (W), tungsten nitride (WN), or aluminum (Al). In an implementation, the wordline WL may include a plurality of layers.

The gate dielectric layer 120 may be on a bottom surface and internal side surfaces of the gate trenches. The gate dielectric layer 120 may conformally cover internal sidewalls of the gate trenches. The gate dielectric layer 120 may be between the wordline WL and the active region ACT. The gate dielectric layer 120 may include, e.g., an oxide, a nitride, or an oxynitride. The gate dielectric layer 120 may be, e.g., a silicon oxide layer or an insulating layer having a high dielectric constant. In an implementation, the gate dielectric layer 120 may be formed by oxidizing the active region ACT, or may be formed by deposition.

The buried insulating layer 125 may be on the wordline WL, and may fill the gate trenches. An upper surface of the buried insulating layer 125 may be on substantially the same level as the upper surface of the substrate 101. The buried insulating layer 125 may be formed of an insulating material, e.g., a silicon nitride.

The barrier pattern 130 may be on the substrate 101. The barrier pattern 130 may cover the wordline structures WLS. The barrier pattern 130 may be between the substrate 101 and the bitline structures BLS. The storage node contact 160 may penetrate through the barrier pattern 130 to be electrically connected to the active region ACT. The barrier pattern 130 may include an insulating material, e.g., a silicon oxide, a silicon nitride, a silicon oxynitride, or combinations thereof.

In an implementation, the barrier pattern 130 may include a first barrier pattern 130a and a second barrier pattern 130b. In an implementation, the first barrier pattern 130a may include a silicon oxide, and the second barrier pattern 130b may include a silicon nitride. In an implementation, the barrier pattern 130 may have three or more layers, or may include other materials.

The bitline structures BLS may extend (e.g., lengthwise) in a direction that is perpendicular to the wordlines WL, e.g., in a Y-direction. The bitline structures BLS may include a bitline BL and a bitline capping pattern BC on the bitline BL.

The bitline BL may include a first conductive pattern 141, a second conductive pattern 142, and a third conductive pattern 143, sequentially stacked. The bitline capping pattern BC may be on the third conductive pattern 143. The barrier pattern 130 may be between the first conductive pattern 141 and the substrate 101, and a portion of the first conductive pattern 141 (hereinafter, referred to as a "bitline contact pattern DC") may be in contact with the first impurity region 105a of the active region ACT through the barrier pattern 130. The bitline BL may be electrically connected to the first impurity region 105a through the bitline contact pattern DC. A lower surface of the bitline contact pattern DC may be on a level, lower than a level of the upper surface of the substrate 101, and may be on a level, higher than a level of the upper surface of the wordlines WL. In an implementation, the bitline contact pattern DC may be in the substrate 101 to be locally in the bitline contact hole 135 exposing the first impurity region 105a.

The first conductive pattern 141 may include a semiconductor material such as polycrystalline silicon. The first conductive pattern 141 may be in direct contact with the first impurity region 105a. The second conductive pattern 142 may include a metal-semiconductor compound. The metal-semiconductor compound may be, e.g., a layer formed by siliciding a portion of the first conductive pattern 141. In an implementation, the metal-semiconductor compound may include, e.g., cobalt silicide (CoSi), titanium silicide (TiSi), nickel silicide (NiSi), tungsten silicide (WSi), or other metal silicide. The third conductive pattern 143 may include a metal, e.g., titanium (Ti), tantalum (Ta), tungsten (W), or aluminum (Al). In an implementation, the number of conductive patterns constituting the bitline BL, the type of material, or the stacking order may vary.

The bitline capping pattern BC may include a first capping pattern, a second capping pattern, and a third capping pattern, sequentially stacked on the third conductive pattern 143. Each of the first to third capping patterns may include an insulating material, e.g., a silicon nitride. The first to third capping patterns may be formed of different materials. Even when the first to third capping patterns include a same material, boundaries therebetween may be distinguished from each other due to a difference in physical properties. A thickness of the second capping pattern may be less than a thickness of each of the first capping pattern and the third capping pattern. In an implementation, the number of capping patterns constituting the bitline capping pattern BC or the type of material may vary.

The spacer structures SS may be on opposite sidewalls of each of the bitline structures BLS to extend in one direction, e.g., the Y-direction. The spacer structures SS may be between the bitline structure BLS and the storage node contact 160. The spacer structures SS may extend along sidewalls of the bitline BL and sidewalls of the bitline capping pattern BC. A pair of spacer structures SS on opposite sides of a single bitline structure BLS may have an asymmetrical shape with respect to the bitline structure BLS. The asymmetrical shape may be formed by or due to the capping insulating layer 180.

The spacer structure SS may include a first spacer 151, a second spacer 152, a third spacer 153, and a fourth spacer 154, sequentially (e.g., outwardly) stacked on a sidewall of the bitline structure BLS. In an implementation, the spacer structure SS may further include bitline contact spacers DCP1 and DCP2.

The first spacer 151 may be on sidewalls of the bitline structures BLS. The first spacer 151 may conformally cover the bitline capping pattern BC and the bitline BL. The first spacer 151 may include an insulating material, e.g., a silicon nitride.

The second spacer 152 may be an air spacer between the first spacer 151 and the third spacer 153. In an implementation, the second spacer 152 may be an air spacer including an insulating material, such as a silicon oxide, remaining therein and having an air gap. An upper end of the second spacer 152 may be defined by the capping insulating layer 180 on the second spacer 152, and may also be defined by a landing pad LP. The second spacer 152 may be in contact with the capping insulating layer 180.

The third spacer 153 may be between the second spacer 152 and the fourth spacer 154. The third spacer 153 may include an insulating material, e.g., a silicon nitride or a silicon oxynitride.

The fourth spacer 154 may be between the third spacer 153 and the storage node contact 160 and between the third spacer 153 and the landing pad LP. In an implementation, one side surface of the fourth spacer 154 may be in contact with the third spacer 153, and another side surface of the fourth spacer 154 may be in contact with the storage node contact 160 and the landing pad LP. The fourth spacer 154 may include an insulating material, e.g., a silicon nitride. An uppermost surface of the fourth spacer 154 may be on a level, higher than a level of an uppermost surface of the third conductive pattern 143.

The third spacer 153 may include a material that is different from that of the fourth spacer 154. The third spacer 153 may include a material having a higher oxygen content than that of the fourth spacer 154. Both the third spacer 153 and the fourth spacer 154 may include nitrogen. A density of the third spacer 153 may be lower than that of the fourth spacer 154.

A first thickness t1 of the third spacer 153 may be less than a second thickness t2 of the first spacer 151 (e.g., as measured in a horizontal direction). In an implementation, the third spacer 153 may have a thickness less than a thickness of each of the first spacer 151 and the fourth spacer 154. The first thickness t1 of the third spacer 153 may be within a range of, e.g., about 5 angstroms to about 10 angstroms.

The third spacer 153 may be a layer formed by a nitridation process, and the fourth spacer 154 may be a layer formed on the third spacer 153 by a deposition process. A thickness of the third spacer 153 may be adjusted depending on conditions of the nitridation process. In an implementation, a thickness of a sacrificial spacer 152' (see FIG. 4A) corresponding to the second spacer 152 may be relatively increased, thereby providing a semiconductor device having improved electrical characteristics.

The fourth spacer 154 may be formed on the third spacer 153 formed by the nitridation process, and pin holes in the fourth spacer 154 may be relatively decreased. In an implementation, a density of the fourth spacer 154 may be relatively increased. Accordingly, the thickness of the fourth spacer 154 may be adjusted to be relatively small and the thickness of the storage node contact 160 to be relatively large, thereby providing a semiconductor device having improved electrical characteristics. In an implementation, the density of the fourth spacer 154 may be relatively increased, and the insulating material remaining in the second spacer 152 may be relatively decreased, thereby providing a semiconductor device having improved electrical characteristics. This may be because the fourth spacer 154 helps prevent a spacer structure SS from being collapsed in a subsequent process, so that a height of an upper end of the second spacer 152 may be maintained at a level, higher than a level of an uppermost surface of the third conductive pattern 143.

The bitline contact spacers DCP1 and DCP2 may fill the remainder of the bitline contact hole 135 in which the bitline contact pattern DC is formed. The bitline contact spacers DCP1 and DCP2 may cover the portion of the first spacer 151 extending in the bitline contact hole 135. The bitline contact spacers DCP1 and DCP2 may be on opposite sidewalls of the bitline contact pattern DC. In an implementation, the bitline contact spacers DCP1 and DCP2 may surround side surfaces of the bitline contact pattern DC. The bitline contact spacers DCP1 and DCP2 may be formed of an insulating material having etch selectivity with respect to the barrier pattern 130. The bitline contact spacers DCP1 and DCP2 may include, e.g., a silicon oxide, a silicon nitride, a silicon oxynitride, or combinations thereof. In an implementation, the bitline contact spacers DCP1 and DCP2 may include a first lower contact spacer DCP1 and a second lower contact spacer DCP2 extending between the first lower contact spacer DCP1 and the first spacer 151 to have a predetermined thickness. The first lower contact spacer DCP1 may include a silicon nitride, and the second lower contact spacer DCP2 may include a silicon oxide. In an implementation, materials and the number of layers of the bitline contact spacers DCP1 and DCP2 may vary.

Referring to the partially enlarged views of FIG. 3 together, the first spacer 151 may extend between the bitline contact pattern DC and the bitline contact spacers DCP1 and DCP2 from a side surface of the bitline BL. In an implementation, an additional spacer layer may be between the bitline contact pattern DC and the bitline contact spacers DCP1 and DCP2, and the first spacer 151 may be on the spacer layer.

The second spacer 152 may be spaced apart from the storage node contact 160 on the bitline contact spacers DCP1 and DCP2. In an implementation, the third and fourth spacers 153 and 154 may be in contact with the storage node contact 160 while recessing a portion of upper ends of the bitline contact spacers DCP1 and DCP2.

The fourth spacer 154 may be spaced apart from the bitline contact spacers DCP1 and DCP2 by the third spacer 153.

The bitline contact spacers DCP1 and DCP2 may include an upper surface in contact with the second spacer 152 and an inclined side surface in contact with the third spacer 153.

Referring to the partially enlarged views of FIG. 3 together, the first spacer 151 may extend onto a portion of an upper surface of the barrier pattern 130 to have an "L" shape or a shape symmetrical thereto. In an implementation, the first spacer 151 may include a vertical extension portion 151V (extending along a side surface of the bitline BL and a side surface of the bitline capping pattern BC), and a horizontal extension portion 151P (covering a portion of the upper surface of the barrier pattern 130).

The second spacer 152 may be on the horizontal extension portion 151P of the first spacer 151.

The third spacer 153 may cover a side (e.g., outer) surface of the second spacer 152 and at least a portion of a side surface of the barrier pattern 130. The third spacer 153 may be in contact with at least one of the first barrier pattern 130a and the second barrier pattern 130b. The third spacer 153 may be in contact with the horizontal extension portion 151P. The third spacer 153 may extend downwardly from or relative to side surfaces of the horizontal extension portion 151P and the barrier pattern 130 from an external side surface of the second spacer 152. Accordingly, a lowermost surface of the third spacer 153 may be on a level, lower than a level of a lowermost surface of the second spacer 152.

The fourth spacer 154 may be spaced apart from the barrier pattern 130 by the third spacer 153.

The insulating patterns 158 may be spaced apart from each other in one direction, e.g., a Y-direction, between the bitline structures BLS, and may be on the barrier pattern 130. The insulating patterns 158 may overlap the wordline structures WLS in plan view. The insulating patterns 158 may be formed of an insulating material having etch selectivity with respect to the barrier pattern 130 under a specific etching condition. In an implementation, the insulating patterns 158 may include a silicon nitride.

The storage node contact 160 may be connected to one region of the active region ACT, e.g., a second impurity region 105b. In an implementation, the storage node contact 160 may include a plurality of storage node contacts 160. As illustrated in FIG. 1, each of the storage node contacts 160 may be between bitline structures BLS adjacent to each other in the X-direction, e.g., between the spacer structures SS on opposite sides of the bitline structures BLS, in plan view. Each of the storage node contacts 160 may be between the wordline structures WLS and between the bitline structures BLS, in plan view. Each of the storage node contacts 160 may fill a space defined by the bitline structures BLS adjacent to each other in the X-direction and the insulating patterns 158 adjacent to each other in the Y-direction. The storage node contacts 160 may be arranged in columns and rows in the X-direction and the Y-direction.

The storage node contact 160 may penetrate through the barrier pattern 130 to electrically connect the second impurity region 105b of the active region ACT and the capacitor structure CAP. The storage node contact 160 may be in direct contact with the second impurity region 105b. A lower end of the storage node contact 160 may be on a level, lower than a level of the upper surface of the substrate 101 and on a level, higher than a level of a lower surface of the bitline contact pattern DC. The storage node contact 160 may be insulated from the bitline contact pattern DC by the bitline contact spacers DCP1 and DCP2.

The storage node contact 160 may be formed of a conductive material, e.g., polycrystalline silicon (Si), titanium (Ti), titanium nitride (TiN), tantalum (Ta), tantalum nitride (TaN), tungsten (W), tungsten nitride (WN), or aluminum (Al). In an implementation, the storage node contact 160 may include a plurality of layers.

The metal-semiconductor layer 165 may be between the storage node contact 160 and the landing pad LP. The metal-semiconductor layer 165 may cover an upper surface of the storage node contact 160. The metal-semiconductor layer 165 may be, e.g., a layer formed by siliciding a portion of the storage node contact 160. In an implementation, the metal-semiconductor layer 165 may include cobalt silicide (CoSi), titanium silicide (TiSi), nickel silicide (NiSi), tungsten silicide (WSi), or other metal silicide. In an implementation, the metal-semiconductor layer 165 may be omitted.

The landing pad LP may electrically connect the storage node contact 160 and the capacitor structure CAP to each other.

The landing pad LP may be between a pair of bitline structures BLS and on the storage node contact 160. The landing pad LP may cover an upper surface of the metal-semiconductor layer 165. The landing pad LP may be in contact with sidewalls of the spacer structures SS between the spacer structures SS. The landing pad LP may penetrate through the capping insulating layer 180 and may be in contact with the capping insulating layer 180.

In an implementation, the landing pad LP may include a plurality of landing pads LP. The plurality of landing pads LP may be arranged in a lattice pattern forming a hexagonal or honeycomb shape. The arrangement of the plurality of landing pads LP may correspond to the arrangement of the capacitor structures CAP.

In an implementation, the landing pad LP may have a double-layer structure including a conductive layer and a barrier layer covering a lower surface and side surfaces of the conductive layer. The conductive layer may include a conductive material, e.g., polycrystalline silicon (Si), titanium (Ti), tantalum (Ta), tungsten (W), or aluminum (Al). The barrier layer may include a metal nitride, e.g., titanium nitride (TiN), tantalum nitride (TaN), or tungsten nitride (WN). The number and shape of the landing pad LP may vary according to example embodiments.

The capping insulating layer 180 may be on the insulating pattern 183 and the bitline structure BLS. The capping insulating layer 180 may overlap the bitline structure BLS, the spacer structure SS, and the landing pad LP. In an implementation, the capping insulating layer 180 may be between the plurality of landing pads LP. The capping insulating layer 180 may have a lower end in contact with the upper surface of the spacer structure SS. The capping insulating layer 180 may penetrate through a portion of the bitline structure BLS to be in contact with the second spacer 152.

Each of the capacitor structures CAP may be in contact with the landing pad LP on the insulating patterns 158. Each of the capacitor structures CAP may include a lower electrode 192, a capacitor dielectric layer 194, and an upper electrode 196. The lower electrode 192 and the upper electrode 196 may include, e.g., a doped semiconductor, a metal nitride, a metal, or a metal oxide. The lower electrode 192 and the upper electrode 196 may include, e.g., polycrystalline silicon, titanium nitride (TiN), tungsten (W), titanium (Ti), ruthenium (Ru), or tungsten nitride (WN). The capacitor dielectric layer 194 may include a high-k dielectric material, e.g., zirconium oxide ($ZrO_2$), aluminum oxide ($Al_2O_3$), or hafnium oxide ($Hf_2O_3$). In an implementation, as illustrated in FIG. 2, the capacitor structure CAP may have a cylindrical shape. In an implementation, the shape of the capacitor structure CAP may have a pillar shape.

FIGS. 4A to 4H are schematic cross-sectional views of stages in a method of manufacturing a semiconductor device according to example embodiments.

Figure 4A:
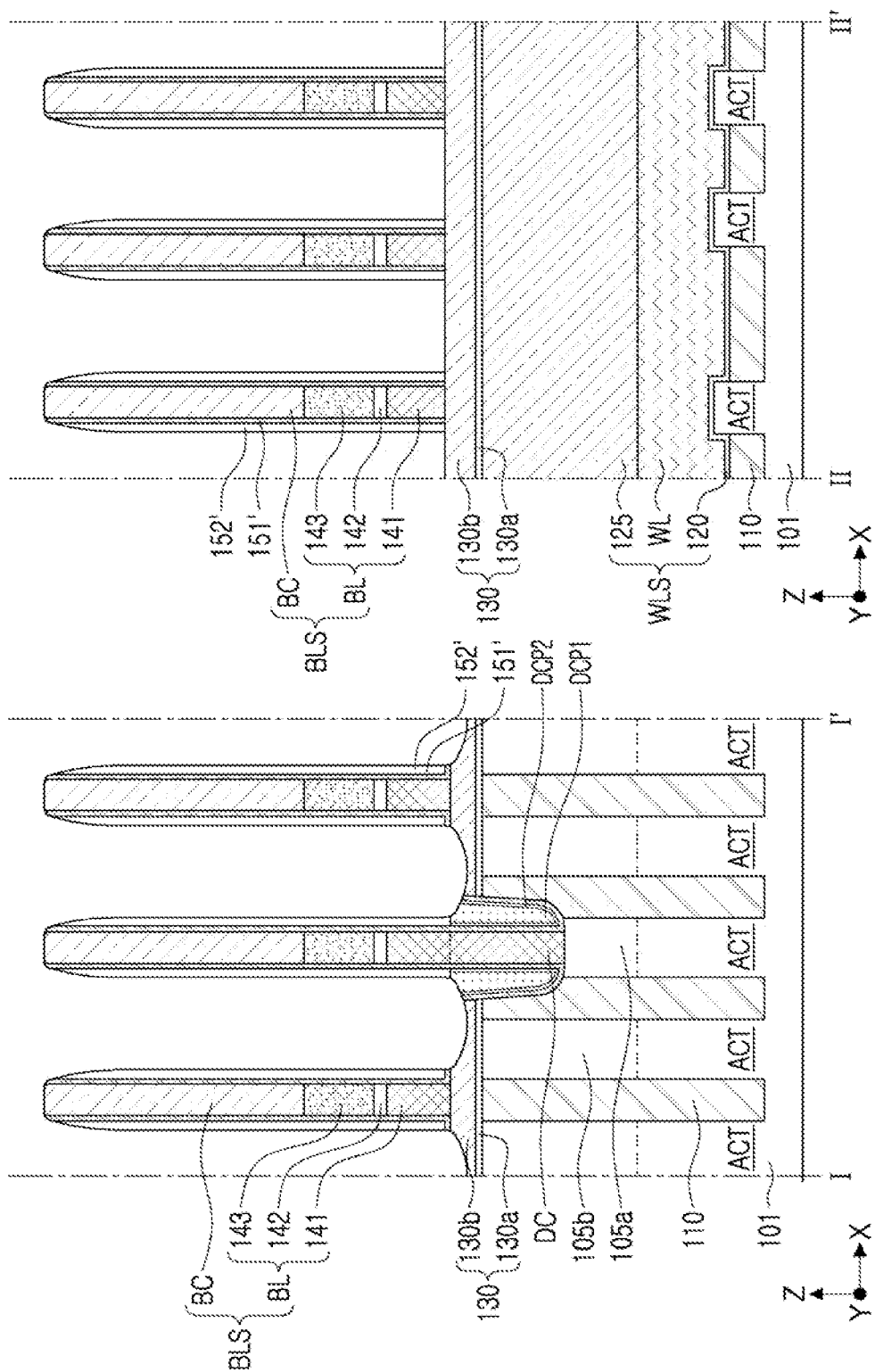
FIGS. 4A to 4H are schematic cross-sectional views of stages in a method of manufacturing a semiconductor device according to example embodiments.

Referring to FIG. 4A, device isolation layers 110 may be formed in a substrate 101 to define an active region ACT, wordline structures WLS may be formed in the substrate 101, bitline structures BLS may be formed on the substrate 101, and first preliminary spacers 151' and sacrificial spacers 152' may be formed on opposite sidewalls of the bitline structures BLS.

According to a shallow trench isolation (STI) process, the substrate 101 may be anisotropically etched to form trenches, insulating materials may be deposited in the trenches, and then a planarization process may be performed to form the device isolation layers 110. Before forming the device isolation layers 110, impurities may be implanted into the substrate 101 to form impurity regions 105a and 105b. In an implementation, the impurity regions 105a and 105b may be formed after forming the device isolation layers 110 or in another process.

The substrate 101 may be anisotropically etched to form gate trenches in which the wordlines WL are disposed. The gate trenches may extend in an X-direction and may cross the active regions ACT and the device isolation layers 110. A gate dielectric layer 120, a wordline WL, and a buried insulating layer 125 may be sequentially formed in the gate trenches. The gate dielectric layer 120 may be formed to have a substantially uniform thickness on internal sidewalls and bottom surfaces of the gate trenches. The gate dielectric layer 120 may be formed by an oxidation process of the active region ACT or a deposition process of a dielectric material. The wordlines WL may be formed by depositing a conductive material in the gate trenches and recessing the deposited conductive material to a predetermined depth from an upper surface thereof. The buried insulating layer 125 may be formed by depositing an insulating material to fill the remainder of the gate trench and then performing a planarization process. Thus, wordline structures WLS may be formed.

Bitline structures BLS may be formed on the substrate 101. Before forming the bitline structures BLS, a barrier pattern 130 may be formed on the substrate 101. The barrier pattern 130 may include, e.g., SiN, SiOC, SiO, SiCN, SiON, or SiOCN. In an implementation, the barrier pattern 130 may be formed by forming a first barrier pattern 130a including a silicon oxide and forming a second barrier pattern 130b including a silicon nitride. The bitline structures BLS may be formed by sequentially stacking layers, constituting the bitline BL and the bitline capping pattern BC, on the barrier pattern 130 and patterning the sequentially stacked layers. The substrate 101 and the barrier pattern 130 may be patterned such that bitline contact holes 135 are formed to respectively expose the first impurity regions 105a, and a portion of a first conductive pattern 141 constituting a bitline BL may then be locally formed in the bitline contact hole 135 to form a bitline contact pattern DC.

A first preliminary spacers 151' and a sacrificial spacer 152' may be sequentially formed, and portions of the first preliminary spacers 151' and the sacrificial spacers 152' may then be removed to expose a portion of an upper surface of the barrier pattern 130. The first preliminary spacer 151' and the sacrificial spacer 152' may be formed by a deposition process, e.g., an atomic layer deposition (ALD) process or a chemical vapor deposition (CVD) process. The barrier pattern 130 may be anisotropically etched with respect to the first preliminary spacer 151' and the sacrificial spacer 152', formed through the deposition process, to expose a portion in which the bitline structures BLS are not disposed. In an implementation, the first preliminary spacer 151' may include a silicon nitride, and the sacrificial spacer may include a silicon oxide.

In an implementation, a portion of the first preliminary spacer 151' may extend into the bitline contact hole 135. In an implementation, after the first preliminary spacer 151' is formed, bitline contact spacers DCP1 and DCP2 may be formed to fill the remainder of the bitline contact hole 135, and the sacrificial spacer 152' may then be formed. In an implementation, the process and order of forming the bitline contact spacers DCP1 and DCP2 may vary.

Figure 4B:
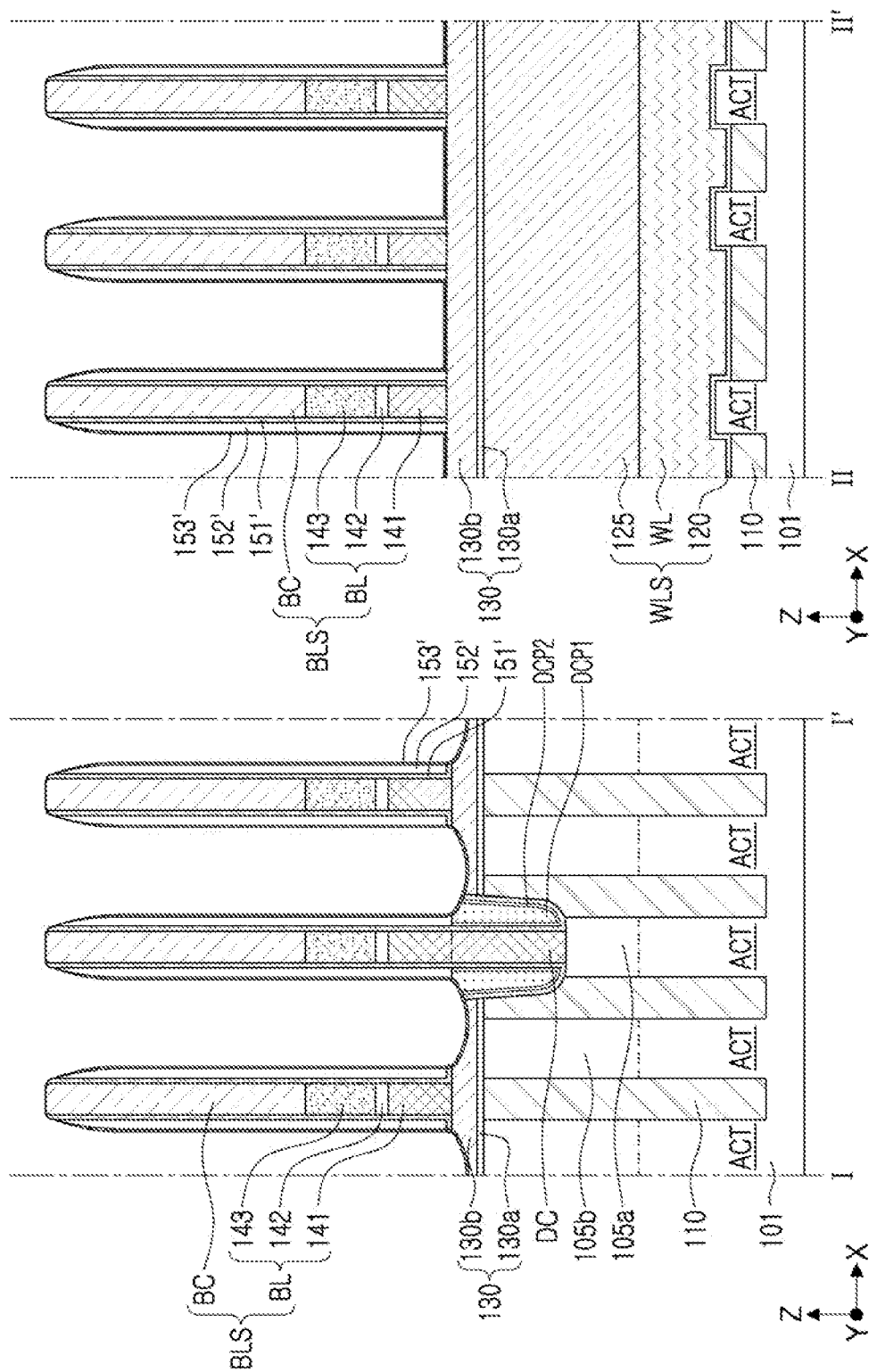

Referring to FIG. 4B, a third preliminary spacer 153' may be formed by performing a nitridation process. The nitridation process may be a plasma nitridation process.

A third preliminary spacer 153' may be formed to cover sidewalls of the sacrificial spacer 152' by performing a nitridation process. A thickness of the third preliminary spacer 153' may be adjusted according to the nitridation process conditions, and may be adjusted within a range of, e.g., about 5 angstroms to about 10 angstroms. The third preliminary spacer 153' may include nitrogen (N) as it is formed by performing a nitridation process. In an implementation, the third preliminary spacer 153' may include a silicon nitride or a silicon oxynitride. The sacrificial spacer 152' may be formed of a silicon oxide layer, and the third preliminary spacer 153' may be a material layer formed by nitriding a surface of the silicon oxide layer with plasma. The third preliminary spacer 153' may help prevent an unnecessary layer, which may be formed on an external sidewall of the sacrificial spacer 152' in a subsequent process, to preserve the thickness of the sacrificial spacer 152'. Also, the third preliminary spacer 153' may help improve the quality of the fourth spacer 154 formed through a subsequent process.

In an implementation, the third preliminary spacer 153' may extend from a sidewall of the sacrificial spacer 152' to cover a portion of the exposed barrier pattern 130 and the bitline contact spacers DCP1 and DCP2.

Figure 4C:
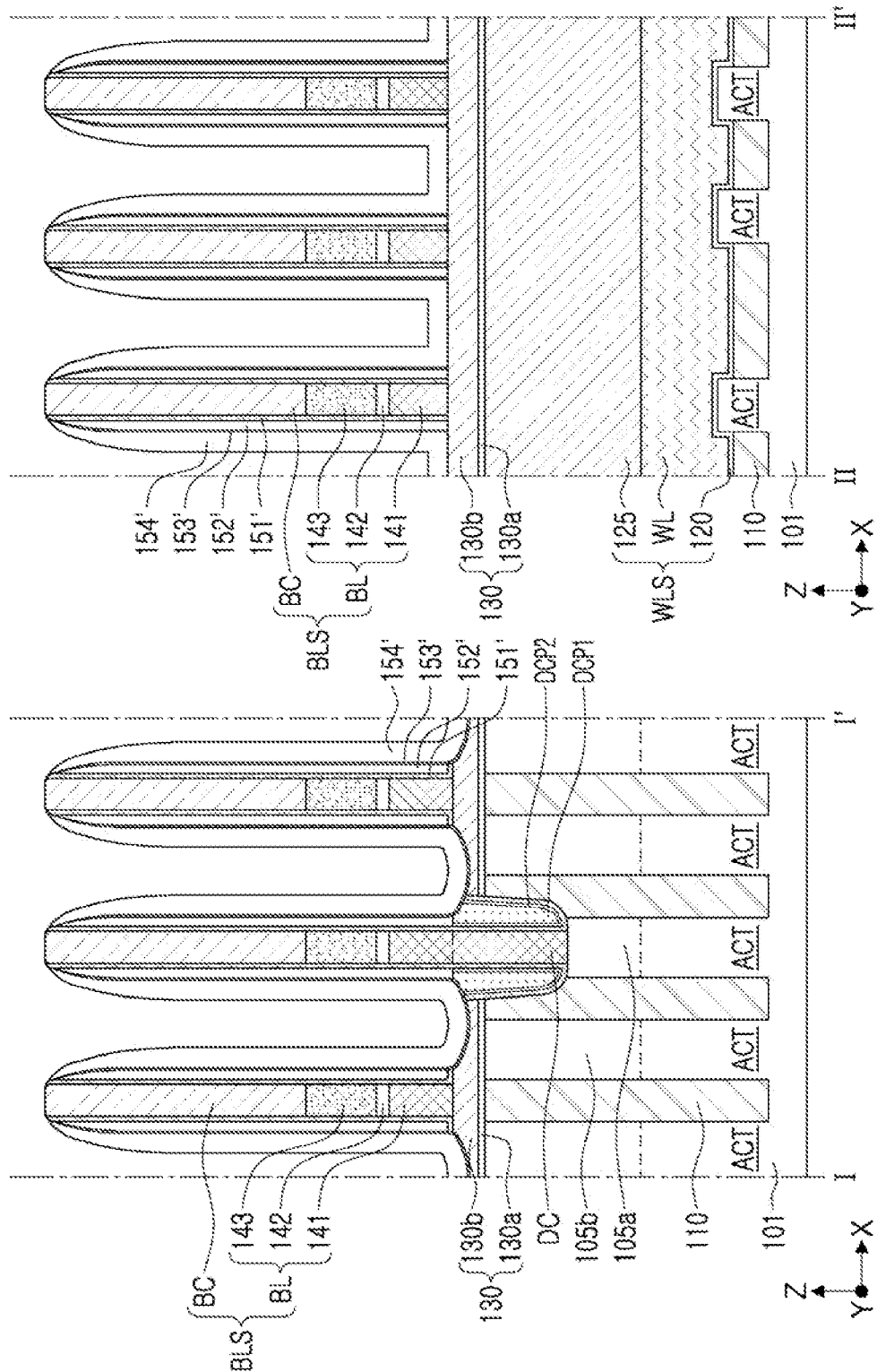

Referring to FIG. 4C, a fourth preliminary spacer 154' may be formed to cover the third preliminary spacer 153'.

The fourth preliminary spacer 154' may be formed through a deposition process, e.g., a chemical vapor deposition (CVD) process or an atomic layer deposition (ALD) process. The fourth preliminary spacer 154' may conformally cover the third preliminary spacer 153' and may be formed to have a thickness, greater than a thickness of the third preliminary spacer 153'. The fourth preliminary spacer 154' may include an insulating material, e.g., a silicon nitride. A boundary between the fourth preliminary spacer 154' and the third preliminary spacer 153' may be (e.g., clearly) distinguishable.

The third preliminary spacer 153' may be formed by a plasma nitridation process to have a significantly small and constant thickness, e.g., a thickness ranging from about 5 angstroms to about 10 angstroms, so that a final thickness of the sacrificial spacer 152' may be easily controlled.

The third preliminary spacer 153' may be a barrier to help prevent a nitrogen element in the fourth preliminary spacer 154' from diffusing into the sacrificial spacer 152'. Accordingly, the third preliminary spacer 153' may help prevent a silicon oxynitride from being formed by reacting the nitrogen element in the fourth preliminary spacer 154' with the silicon oxide of the sacrificial spacer 152', so that the thickness of the 152' may be prevented from decreasing, and formation of pin holes may be significantly reduced or prevented in the fourth preliminary spacer 154' when the nitrogen element in the fourth preliminary spacer 154' escapes.

In an implementation, the fourth preliminary spacer 154' may be formed by performing a deposition process on the third preliminary spacer 153', and spacer performance may be improved as compared with spacer performance when a deposition process is performed on the sacrificial spacer 152'. In an implementation, the third preliminary spacer 153' may significantly reduce or prevent the formation of pin holes in the fourth preliminary spacer 154', and a density of the fourth preliminary spacer 154' may be prevented from decreasing, so that the fourth preliminary spacer 154' may be formed to have desired rigidity.

Figure 4D:
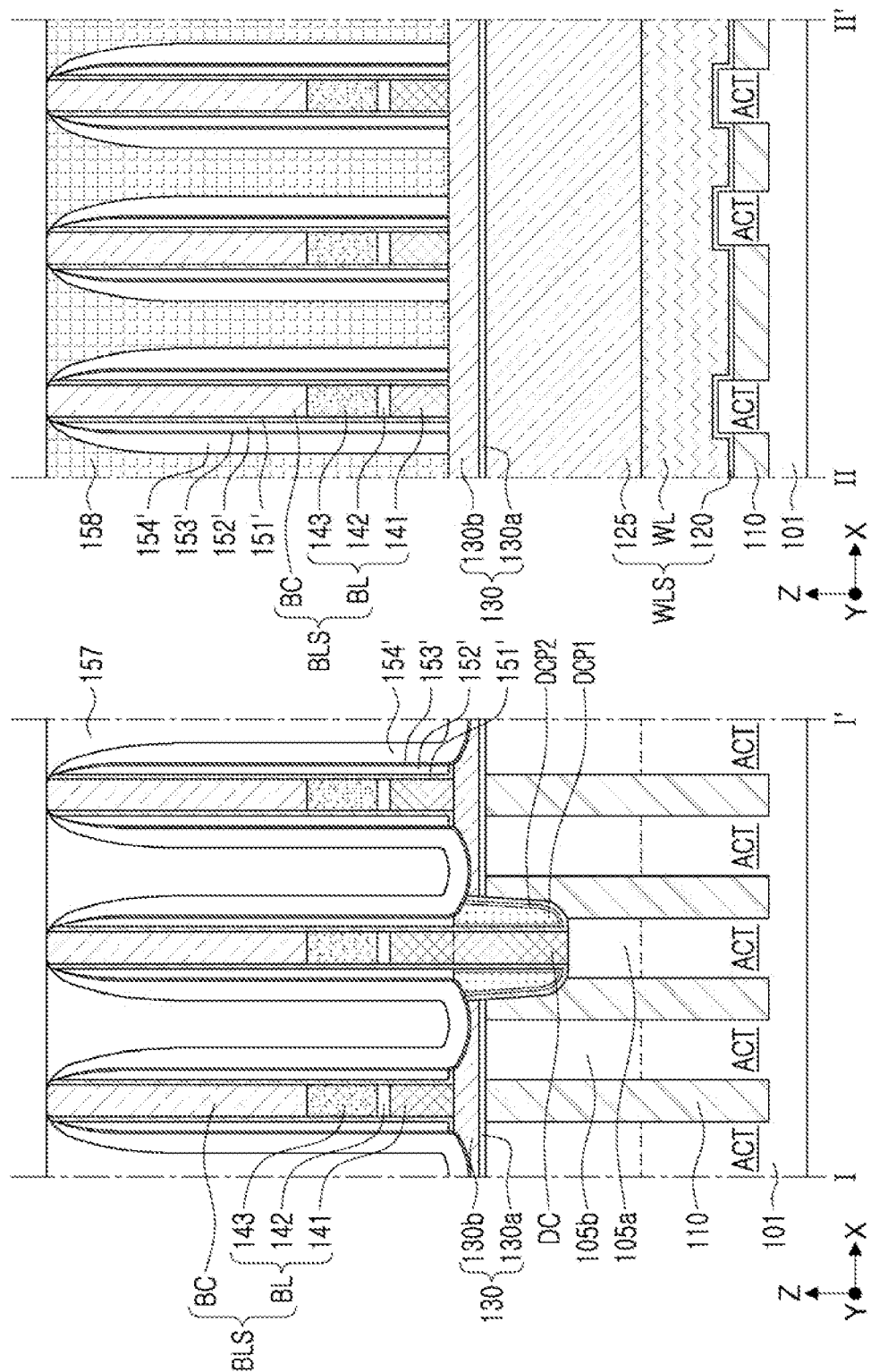

Referring to FIG. 4D, insulating patterns 158 may be formed on the barrier pattern 130 between the bitline structures BLS.

The insulating patterns 158 may be formed by forming sacrificial patterns 157 between the bitline structures BLS, etching a portion of the sacrificial patterns 157, and filling the etched portion with an insulating material, different from a material of the sacrificial patterns 157, e.g., a silicon nitride. In an implementation, the insulating patterns 158 may overlap the wordline structures WLS in the Z-direction. The sacrificial patterns 157 and the insulating patterns 158 may be alternately disposed in the Y-direction.

Figure 4E:
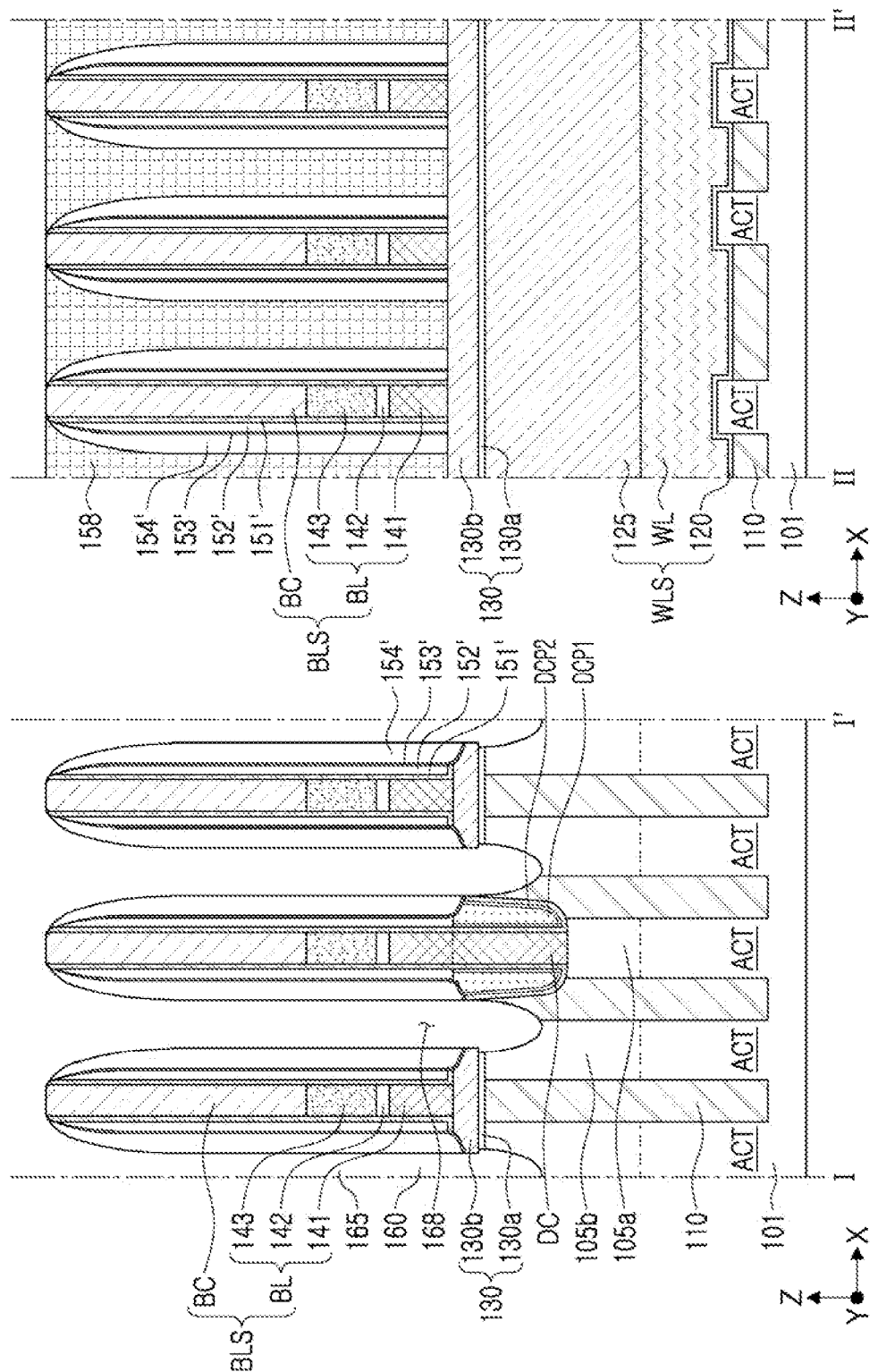

Referring to FIG. 4E, the sacrificial patterns 157 may be etched to form contact openings 168.

The sacrificial patterns 157 may be selectively etched with respect to the insulating patterns 158 to form a contact opening 168. The contact opening 168 may penetrate through the fourth preliminary spacer 154', the third preliminary spacer 153', and the barrier pattern 130 together with the sacrificial patterns 157. In an implementation, the contact opening 168 may remove a portion of the active region ACT of the substrate 101 to expose the second impurity regions 105b.

In an implementation, when the contact opening 168 is formed, a portion of the device isolation layers 110 may be etched and a portion of the bitline contact spacers DCP1 and DCP2 may be exposed.

Figure 4F:
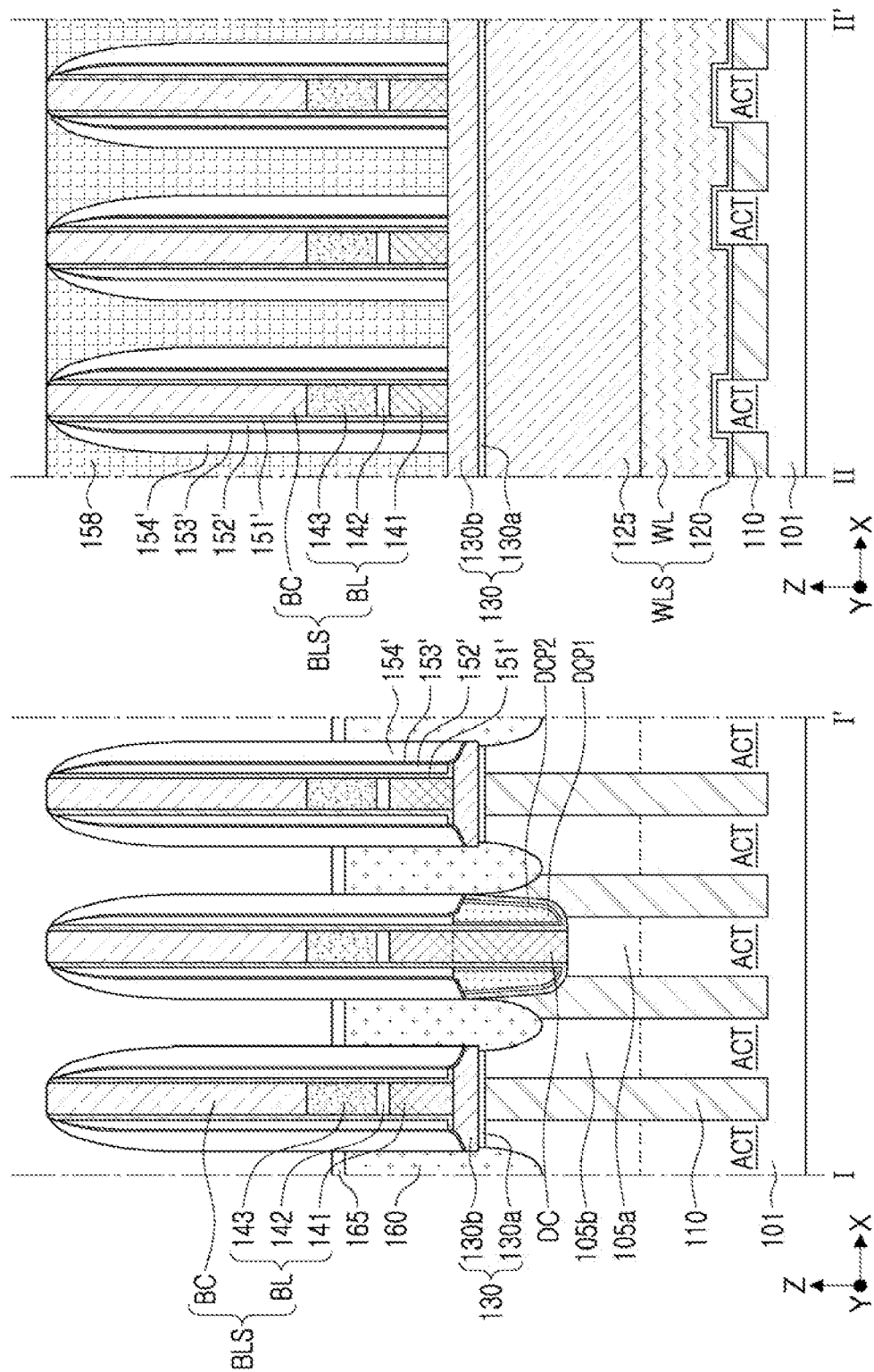

Referring to FIG. 4F, a storage node contact 160 and a metal-semiconductor layer 165 may be formed.

The storage node contact 160 may be formed by filling a space between the bitline structures BLS and a space between the wordline structures WLS with a conductive material together with the contact opening 168 and then performing an etching process. The conductive material may include, e.g., a doped semiconductor material, a metal, or a metal nitride. In an implementation, the conductive material may include polycrystalline silicon.

A metal-semiconductor layer 165 may be formed on the storage node contact 160. The metal-semiconductor layer 165 may be formed by reacting an upper surface of the storage node contact 160 with a metal. The reaction may include, e.g., a silicide process.

Figure 4G:
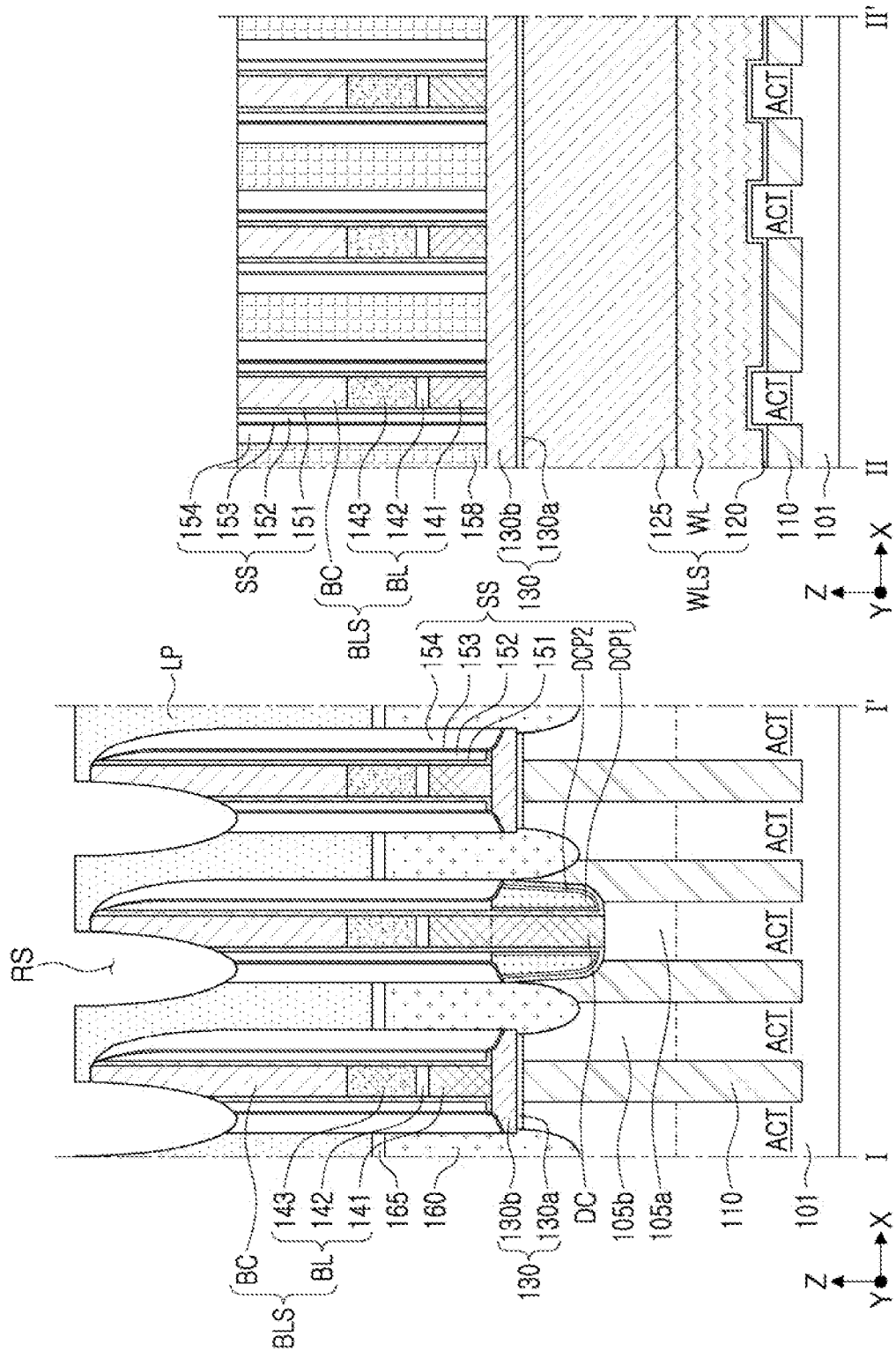

Referring to FIG. 4G, a landing pad LP may be formed on the storage node contact 160, and a second spacer 152 may be formed.

The landing pad LP may be formed on the storage node contact 160 to be in contact with the fourth spacer 154. The landing pad LP may extend between the bitline structures BLS, and the landing pads LP connected to each of the storage node contacts 160 may be separated from each other.

An etching process may be additionally performed using the landing pad LP as an etching mask. The etching process may be performed on a region, in which the landing pad LP is not disposed, to remove a portion of the bitline capping pattern BC, a portion of each of the first, third, and fourth preliminary spacers 151', 153', and 154', a portion of the sacrificial spacer 152', and a portion of each of the insulating patterns 158. Accordingly, the first, third, and fourth spacers 151, 153, and 154 may be formed, and recess regions RS corresponding to positions, each of which having a capping insulating layer 180 (see FIG. 4H) formed between the landing pads LP, may be formed. In the present operation, the sacrificial spacer 152' may be exposed by the recess regions RS.

The sacrificial spacer 152' may be removed through the exposed space, and the second spacer 152, an air spacer, may be formed by capping an upper end portion of the space, in which the sacrificial spacer 152' is removed, through a subsequent process.

As described above, the third preliminary spacer 153' may help prevent the thickness of the sacrificial spacer 152' from decreasing, so that a volume of the second spacer 152, an air spacer, may be significantly secured. Accordingly, parasitic capacitance generated between the storage node contact 160 and the bitline structure BLS may be significantly reduced.

Figure 4H:
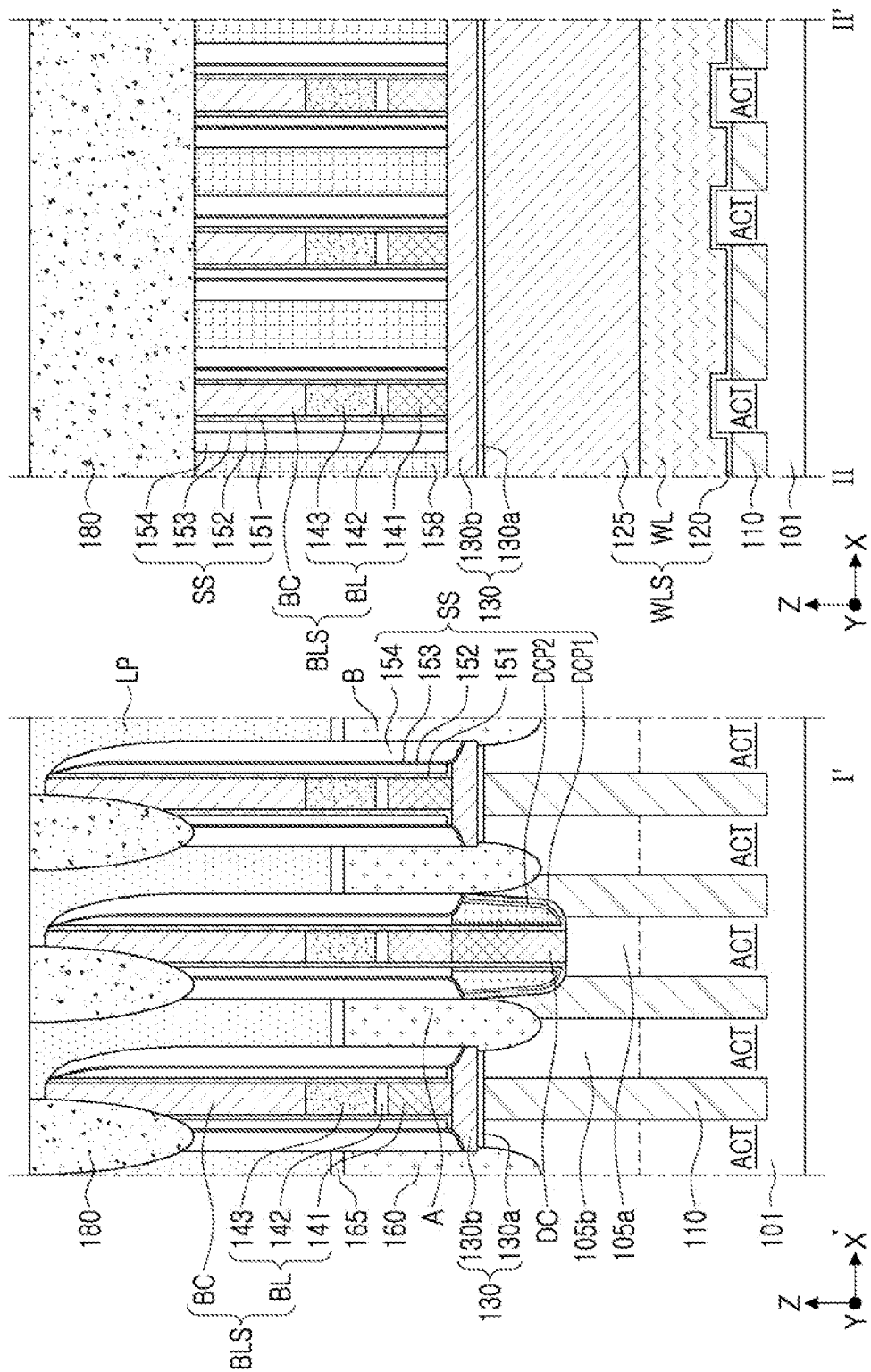

Referring to FIG. 4H, a capping insulating layer 180 may be formed on the bitline structure BLS and the insulating patterns 158.

The capping insulating layer 180 may extend between the landing pads LP and may cover bottom surfaces of the recess regions RS. An upper end portion of the second spacer 152 may be capped by the capping insulating layer 180. In an implementation, a portion of the capping insulating layer 180 may extend into the second spacer 152, an air spacer.

Referring to FIGS. 1 to 3, a planarization process or an etch-back process may be performed to remove a portion of the capping insulating layer 180, and then a capacitor structure CAP may be formed on the landing pad LP. As a result, the semiconductor device 100 of FIGS. 1 to 3 may be manufactured.

Figure 5A:
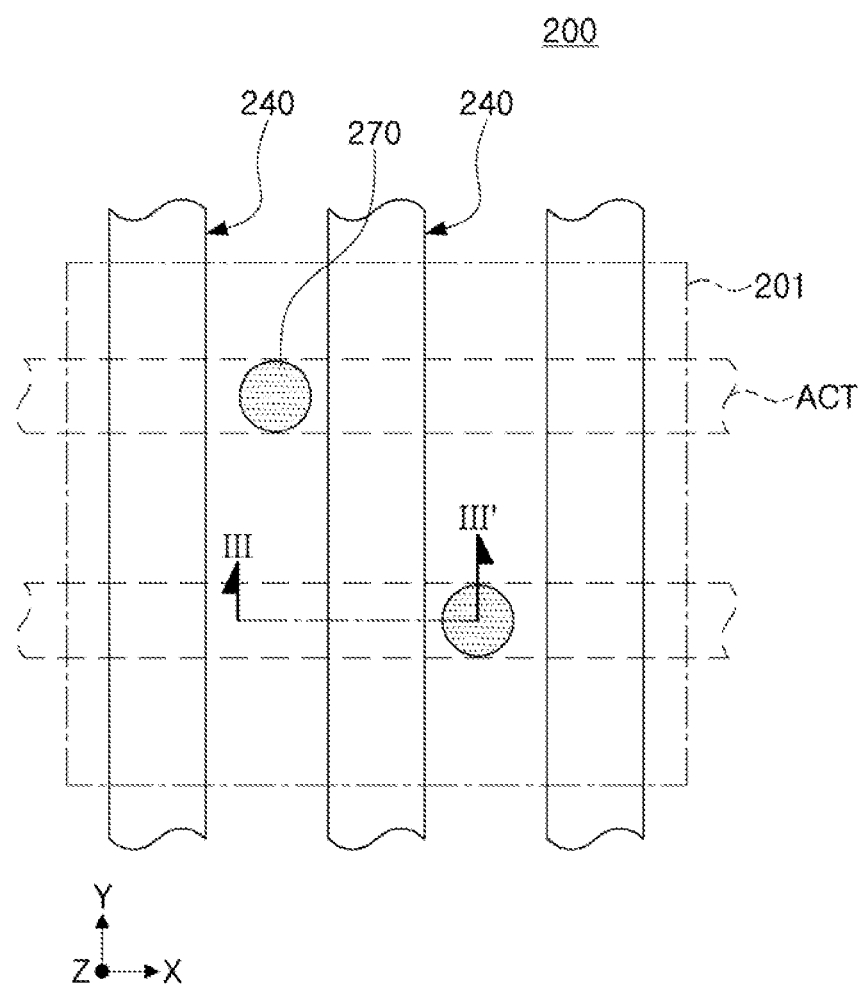
FIGS. 5A and 5B are a schematic plan view and a schematic cross-sectional view of a semiconductor device according to example embodiments, respectively.
Figure 5B:
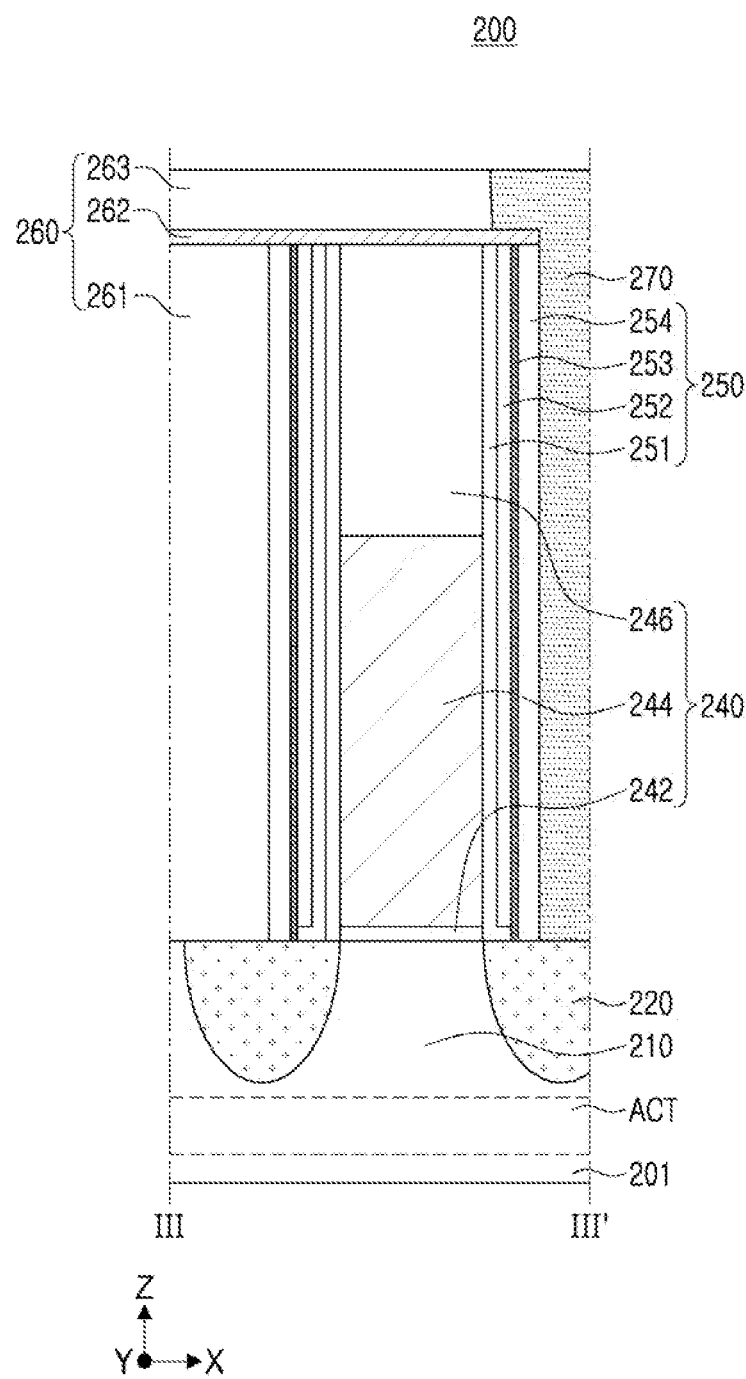

FIGS. 5A and 5B are a schematic plan view and a schematic cross-sectional view of a semiconductor device according to example embodiments, respectively. FIG. 5B illustrates a cross-section taken along line of FIG. 5A.

Referring to FIGS. 5A and 5B, a semiconductor device 200 may include substrate 201, an active region ACT on the substrate 201, a channel layer 210 on the active region ACT, a source/drain region 220 in contact with the channel layer 210, a gate structure 240 extending to cross the active region ACT, spacer structure 250, insulating layers 260, and contact plugs 270 connected to the source/drain region 220. In an implementation, the semiconductor device 200 may be a fin-type field effect transistor in which the channel layer 210 has a fin structure. In an implementation, the semiconductor device 200 may be a transistor having a multi-bridge channel field effect transistor (MBCFET) structure, a gate-all-around (GAA) type FET.

The active region ACT may be defined by device isolation layers in the substrate 101, and may extend in, e.g., the X-direction.

The channel layer 210 may be on the active region ACT. In an implementation, the channel layer 210 may be in the form of a fin extending to be connected to the active region ACT. In an implementation, the channel layer 210 may be a plurality of layers spaced apart from the active region ACT in the Z-direction.

The source/drain regions 220 may be on the active region ACT, on at least one side of the channel layer 210. The source/drain regions 220 may include impurities having different types and/or different concentrations. In an implementation, the source/drain region 220 may include N-type doped silicon (Si) or P-type doped silicon-germanium (SiGe).

The gate structure 240 may extend in one direction, e.g., in the Y-direction, while intersecting the active region ACT. Channel regions of transistors may be formed in the active region ACT or the channel layer 210 intersecting the gate structure 240. The gate structure 240 may include a gate electrode 244, a gate dielectric layer 242 between the gate electrode 244 and the channel layer 210, and a gate capping layer 246 on an upper surface of the gate electrode 244.

The gate dielectric layer 242 may cover at least a portion of surfaces of the gate electrode 244. In an implementation, the gate dielectric layer 242 may cover only a lowermost surface of the gate electrode 244. In an implementation, the gate dielectric layer 242 may surround all surfaces of the gate electrode 244, except for an uppermost surface thereof. In this case, the gate dielectric layer 242 may extend between the gate electrode 244 and the spacer structure 250. The gate dielectric layer 242 may include an oxide, a nitride, or a high-k dielectric material. The high-k dielectric material may refer to a dielectric material having a dielectric constant, higher than that of a silicon oxide layer ($SiO_2$). The high dielectric constant material may include, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode 244 may include a conductive material, e.g., a metal nitride such as titanium nitride (TiN), tantalum nitride (TaN), or tungsten nitride (WN), or a metal such as aluminum (Al), tungsten (W), or molybdenum (Mo), or a semiconductor material such as doped polysilicon. The gate electrode 244 may include two or more layers.

The gate capping layer 246 may be on the gate electrode 244 and may include an insulating material, e.g., a silicon nitride (SiN).

The spacer structure 250 may be on opposite sidewalls of the gate electrode 244 and may extend in the Z-direction, perpendicular to an upper surface of the substrate 101. The spacer structure 250 may include first to fourth spacers 251, 252, 253, and 254, sequentially stacked on the opposite sidewalls of the gate electrode 244.

The first spacer 251 may include an insulating material, e.g., a silicon nitride. The second spacer 252 may be an air spacer between the first spacer 251 and the third spacer 253. In an implementation, the second spacer 252 may be an air spacer including an insulating material, e.g., a silicon oxide, remaining therein and having an air gap. The third spacer 253 may be on a sidewall of the second spacer 252 and may include an insulating material, e.g., a silicon oxynitride. The fourth spacer 254 may be between the third spacer 253 and the insulating layers 260 and may include an insulating material, e.g., a silicon nitride.

The third spacer 253 may have a thickness less than a thickness of each of the first spacer 251 and the fourth spacer 254. The thickness of the third spacer 253 may be within a range of, e.g., about 5 angstroms to 10 angstroms.

The third spacer 253 may be a layer formed through a nitridation process, and the fourth spacer 254 may be a layer formed on the third spacer 253 through a deposition process. The thickness of the third spacer 253 may be adjusted depending on conditions of the nitriding process. Accordingly, a thickness of a sacrificial spacer may be relatively increased, thereby providing a semiconductor device having improved electrical characteristics.

The insulating layers 260 may cover the gate structure 240 on the substrate 101. The insulating layers 260 may include a silicon oxide, a silicon nitride, a silicon oxynitride, or combinations thereof. In an implementation, the insulating layers 260 may include a first interlayer insulating layer 261 covering the substrate 101 and the active region ACT, a capping insulating layer 262 covering the gate structure 240 on the first interlayer insulating layer 261, and a second interlayer insulating layer 263 on the capping insulating layer 262. The capping insulating layer 262 may cover the spacer structure 250, and may cover an upper end of an air spacer to define the second spacer 252. In an implementation, the capping insulating layer 262 may include a protrusion portion, downwardly convex or protruding from a surface in contact with the second spacer 252.

The contact plugs 270 may penetrate through the insulating layer 260, may be connected to the source/drain region 220, and may apply an electrical signal to the source/drain region 220. In an implementation, the contact plugs 270 may have inclined side surfaces in which a width of a lower portion is narrower than a width of an upper portion depending on an aspect ratio. The contact plugs 270 may include, e.g., a metal nitride such as titanium nitride (TiN), tantalum nitride (TaN), or tungsten nitride (WN), or a metal such as aluminum (Al), tungsten (W), or molybdenum (Mo).

In an implementation, the spacer structure 250 may be a spacer structure on opposite sidewalls of the gate structure 240 intersecting the active region ACT. In an implementation, the spacer structure 250 may include a spacer structure surrounding a plurality of interconnections including a conductive material, as well as to a gate structure.

By way of summation and review, semiconductor devices may have high degrees of integration and high performance. To manufacture a high-performance semiconductor device, a technology for significantly reducing parasitic capacitance between adjacent conductive structures may help suppress a decrease in signal transmission speed caused by RC delay.

As described above, according to example embodiments, a spacer structure may be optimized to provide a semiconductor device having improved electrical characteristics or reliability.

One or more embodiments may provide a semiconductor device having improved electronic characteristics or reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first active region and a second active region;
a bitline structure extending in one direction on the substrate, the bitline structure being electrically connected to the first active region and including a bitline and a bitline capping pattern sequentially stacked;
a storage node contact on a sidewall of the bitline structure, the storage node contact being electrically connected to the second active region;
a spacer structure between the bitline structure and the storage node contact;
a landing pad on the storage node contact, the landing pad being in contact with a sidewall of the spacer structure; and
a capacitor structure electrically connected to the landing pad,
wherein:
the spacer structure includes a first spacer, a second spacer, a third spacer, and a fourth spacer, sequentially stacked on the sidewall of the bitline structure,
the second spacer is an air spacer,
the third spacer has a thickness that is less than a thickness of the first spacer,
the second spacer includes a first portion at a level that is higher than a level of an uppermost surface of the bitline, and
the first portion of the second spacer is spaced apart from the fourth spacer by the third spacer.

2. The semiconductor device as claimed in claim 1, further comprising a barrier pattern between the substrate and the bitline structure, wherein:
the first spacer covers a side surface of the bitline and a side surface of the bitline capping pattern,
the second spacer covers a side surface of the first spacer, and
the third spacer covers a side surface of the second spacer and at least a portion of a side surface of the barrier pattern.

3. The semiconductor device as claimed in claim 2, wherein:
the first spacer includes:
a vertical extension portion extending along the side surface of the bitline and the side surface of the bitline capping pattern, and
a horizontal extension portion covering a portion of an upper surface of the barrier pattern,
the second spacer is on the horizontal extension portion, and
the third spacer is in contact with the horizontal extension portion.

4. The semiconductor device as claimed in claim 2, wherein:
the barrier pattern includes a first barrier pattern and a second barrier pattern, sequentially stacked,
the first barrier pattern includes a silicon oxide,
the second barrier pattern includes a silicon nitride, and
the third spacer is in contact with at least one of the first barrier pattern and the second barrier pattern.

5. The semiconductor device as claimed in claim 1, wherein:
the bitline structure further includes a bitline contact pattern electrically connected to the first active region,
the spacer structure further includes a bitline contact spacer surrounding a sidewall of the bitline contact pattern, and
the fourth spacer is spaced apart from the bitline contact spacer.

6. The semiconductor device as claimed in claim 5, wherein the bitline contact spacer has an upper surface in contact with the second spacer and an inclined side surface in contact with the third spacer.

7. The semiconductor device as claimed in claim 1, wherein a lowermost surface of the third spacer is on a level that is lower than a level of a lowermost surface of the second spacer.

8. The semiconductor device as claimed in claim 1, wherein:
the bitline includes a first conductive pattern, a second conductive pattern, and a third conductive pattern sequentially stacked on the substrate, and
the bitline capping pattern is on the bitline, and
an uppermost surface of the fourth spacer is on a level that is higher than a level of an uppermost surface of the third conductive pattern.

9. The semiconductor device as claimed in claim 1, wherein the third spacer has a thickness of about 5 angstroms to about 10 angstroms.

10. The semiconductor device as claimed in claim 1, further comprising a capping insulating layer on the bitline structure, the capping insulating layer penetrating through a portion of the bitline structure and being in contact with the second spacer.

11. The semiconductor device as claimed in claim 1, wherein an oxygen content of the third spacer is higher than an oxygen content of the fourth spacer.

12. The semiconductor device as claimed in claim 1, wherein a density of the third spacer is lower than a density of the fourth spacer.

13. A semiconductor device, comprising:
a substrate including a first active region and a second active region;
a bitline structure extending in one direction on the substrate and being electrically connected to the first active region;
a storage node contact on a sidewall of the bitline structure and electrically connected to the second active region;
a spacer structure between the bitline structure and the storage node contact;
a landing pad on the storage node contact and in contact with a sidewall of the spacer structure; and
a capacitor structure electrically connected to the landing pad,
wherein:
the spacer structure includes a first spacer, a second spacer, a third spacer, and a fourth spacer, sequentially stacked on the sidewall of the bitline structure,
the second spacer is an air spacer,
the third spacer and the fourth spacer include different materials from one another, and
the lowermost surface of the third spacer is on a level that is lower than a level of the lowermost surface of the second spacer.

14. The semiconductor device as claimed in claim 13, wherein the third spacer further includes a portion extending toward the substrate from a side surface of the second spacer.

15. The semiconductor device as claimed in claim 13, wherein the third spacer has a thickness that is less than a thickness of the first spacer and less than a thickness of the fourth spacer.

16. The semiconductor device as claimed in claim 13, wherein:
the first spacer and the fourth spacer each include a silicon nitride, and
the third spacer includes a silicon oxynitride.

17. The semiconductor device as claimed in claim 13, further comprising a capping insulating layer on the bitline structure and penetrating through a portion of the bitline structure, the capping insulating layer being in contact with the first to fourth spacers.

18. A semiconductor device, comprising:
a substrate;
a plurality of interconnections on the substrate;
an interlayer insulating layer on the substrate;
a spacer structure between the interlayer insulating layer and the plurality of interconnections; and
a capping layer covering the interlayer insulating layer, the plurality of interconnections, and an upper surface of the spacer structure,
wherein:
the spacer structure includes a first spacer, a second spacer, a third spacer, and a fourth spacer, sequentially stacked on the plurality of interconnections,
the second spacer is an air spacer,
the third spacer includes a silicon oxynitride, and
the third spacer has a maximum thickness in a horizontal direction that is less than a maximum thickness of the first spacer in the horizontal direction, less than a maximum thickness of the second spacer in the horizontal direction, and less than a maximum thickness of the fourth spacer in the horizontal direction.

19. The semiconductor device as claimed in claim 18, further comprising a contact plug penetrating through the interlayer insulating layer, wherein:
the plurality of interconnections are spaced apart from the contact plug by the spacer structure.

20. The semiconductor device as claimed in claim 1, wherein the lowermost surface of the third spacer is on a level that is lower than a level of the lowermost surface of the second spacer.

* * * * *